US005955224A

United States Patent [19]

Caspar et al.

[11] Patent Number: 5,955,224
[45] Date of Patent: Sep. 21, 1999

[54] THERMALLY IMAGEABLE MONOCHROME DIGITAL PROOFING PRODUCT WITH IMPROVED NEAR IR-ABSORBING DYE(S)

[75] Inventors: Jonathan V. Caspar, Henry Clay Village, Del.; Gregory Charles Weed, Towanda, Pa.

[73] Assignee: E. I. du Pont de Nemours and Company, Wilmington, Del.

[21] Appl. No.: 09/177,153

[22] Filed: Oct. 22, 1998

Related U.S. Application Data

[63] Continuation of application No. 08/887,808, Jul. 3, 1997, abandoned.

[51] Int. Cl.$^6$ .............................. G03C 1/49; G03C 1/73; G03C 7/00
[52] U.S. Cl. .................. 430/17; 430/332; 430/338; 430/342; 430/343; 430/344; 430/944; 430/964
[58] Field of Search ................... 430/343, 344, 430/338, 342, 964, 944, 332, 17

[56] References Cited

U.S. PATENT DOCUMENTS

| | | | |
|---|---|---|---|
| 3,042,515 | 7/1962 | Wainer | 96/48 |
| 3,042,516 | 7/1962 | Wainer | 96/48 |
| 3,383,212 | 5/1968 | MacLachlan | 96/48 |
| 3,390,995 | 7/1968 | Manos | 96/48 |
| 3,390,996 | 7/1968 | MacLachlan | 96/48 |
| 3,445,234 | 5/1969 | Cescon et al. | 96/90 |
| 3,479,185 | 11/1969 | Chambers, Jr. | 96/84 |
| 3,493,376 | 2/1970 | Fichter, Jr. | 96/90 |
| 3,563,750 | 2/1971 | Walker | 96/90 |
| 3,585,038 | 6/1971 | Cescon et al. | 96/90 |
| 3,615,454 | 10/1971 | Cescon et al. | 96/35.1 |
| 3,615,481 | 10/1971 | Looney | 96/48 |
| 3,615,567 | 10/1971 | Wilson | 96/90 R |
| 3,784,557 | 1/1974 | Cescon | 260/309 |
| 4,298,678 | 11/1981 | McKeever . | |
| 4,311,783 | 1/1982 | Dessauer | 430/270 |
| 4,332,884 | 6/1982 | Uji-Ie et al. | 430/338 |
| 4,356,252 | 10/1982 | Lee | 430/270 |
| 4,410,621 | 10/1983 | Wada et al. | 430/281 |
| 4,423,139 | 12/1983 | Isbrandt et al. | 430/338 |
| 4,495,020 | 1/1985 | Nakabayashi et al. | 156/314 |
| 4,551,413 | 11/1985 | Bell | 430/270 |
| 4,581,325 | 4/1986 | Kitchin et al. | 430/522 |
| 4,622,286 | 11/1986 | Sheets | 430/343 |
| 4,634,657 | 1/1987 | Holman, III | 430/281 |
| 4,656,121 | 4/1987 | Sato et al. | 430/495 |
| 4,743,091 | 5/1988 | Gelbart | 350/252 |
| 4,882,265 | 11/1989 | Laganis et al. | 430/522 |
| 4,929,530 | 5/1990 | Saeki et al. | 430/138 |
| 4,942,141 | 7/1990 | De Boer et al. | 503/227 |
| 4,962,009 | 10/1990 | Washizu et al. | 430/138 |
| 4,973,572 | 11/1990 | De Boer | 503/227 |
| 4,981,769 | 1/1991 | Saeki et al. | 430/138 |
| 5,019,549 | 5/1991 | Kellogg et al. | 503/227 |
| 5,051,333 | 9/1991 | Yanigahara et al. | 430/438 |
| 5,093,492 | 3/1992 | Acker et al. | 544/123 |
| 5,146,087 | 9/1992 | Vandusen | 251/271 |
| 5,156,938 | 10/1992 | Foley et al. | 430/200 |
| 5,171,650 | 12/1992 | Ellis et al. | 430/20 |
| 5,286,604 | 2/1994 | Simmons, III | 430/286 |
| 5,330,884 | 7/1994 | Fabricius et al. | 430/522 |
| 5,407,783 | 4/1995 | Caruso | 430/288 |
| 5,440,042 | 8/1995 | Fabricius et al. | 544/315 |
| 5,494,772 | 2/1996 | Hosoi et al. | 430/343 |
| 5,536,626 | 7/1996 | Fabricius et al. | 430/522 |
| 5,576,443 | 11/1996 | Fabricius et al. | 548/237 |
| 5,858,583 | 1/1999 | Dessauer et al. | 430/964 |

FOREIGN PATENT DOCUMENTS

| | | |
|---|---|---|
| 0 243 936 A2 | 4/1987 | European Pat. Off. .......... G03F 7/10 |
| 0 321 923 B1 | 7/1992 | European Pat. Off. ......... B41M 5/26 |
| 42 40 141 A1 | 6/1994 | Germany . |
| 59-72438 | 4/1984 | Japan ............... G03C 1/00 |
| 60-95430 | 5/1985 | Japan ............... G03C 1/00 |
| 60-98433 | 6/1985 | Japan ............... G03C 1/80 |
| 60-191238 | 9/1985 | Japan ............... G03C 1/00 |
| 5-229251 | 9/1993 | Japan ............... B41M 5/18 |
| 5-301448 | 11/1993 | Japan ............... B41M 5/18 |
| 7-32738 | 2/1995 | Japan ............... B41M 5/18 |
| 7-228051 | 8/1995 | Japan ............... B41M 5/18 |
| 8-39935 | 2/1996 | Japan ............... B41M 5/18 |
| 8-297364 | 11/1996 | Japan . |

OTHER PUBLICATIONS

Brochure of H. W. Sands, 1080 E. Indiantown Road—Suite 206, Jupiter, Florida 33477 407–743–8090, Laser Dyes, Aug. 1992.

*Primary Examiner*—Richard L. Schilling

[57] ABSTRACT

Novel thermally imageable monochrome product compositions, elements, and processes are disclosed herein. These compositions and elements characteristically have high contrast and fast imaging speeds. The thermally imageable compositions of this invention comprise (a) at least one near IR-absorbing dye having the structure given in the specification; (b) at least one HABI compound; (c) at least one leuco dye; (d) at least one acid-generating compound; and (e) a polymeric binder. Optionally at least one UV stabilizer and/or at least one inhibitor of color formation can also be present. These compositions have the propensity for affording, upon imaging, highly colored images having high optical density values. At the same time, background color is low in preferred compositions even after extensive exposure to ambient light. These compositions are imagewise exposed to near IR radiation from a laser or other device to effect color formation (i.e., generation of an image).

31 Claims, No Drawings

THERMALLY IMAGEABLE MONOCHROME DIGITAL PROOFING PRODUCT WITH IMPROVED NEAR IR-ABSORBING DYE(S)

This is a continuation of application Ser. No. 08/887,808 filed Jul. 3, 1997, now abandoned.

FIELD OF THE INVENTION

This invention is concerned with storage-stable, thermally imageable, color-forming compositions and elements, which are imageable with near infrared (near-IR) radiation. The invention is also directed to processes for forming colored images employing such compositions and elements.

BACKGROUND OF THE INVENTION

Photoimageable compositions comprising hexaarylbimidazole (HABI) compound(s) and leuco dye(s) and which are imaged using ultraviolet radiation (UV means) are known.

Additives have been reported which enhance the performance for special applications. The use of sensitizing dyes, has been reported, such as in U.S. Pat. No. 3,563,750 to make the coatings responsive to visible light. U.S. Pat. No. 3,615,567 describes inorganic halide intensifiers in photoimageable compositions. The use of organic halogen derivatives in combination with leucodyes is described in patents issued to Photohorizons Co., such as U.S. Pat. Nos. 3,493,376, 3,042,515, and 3,042,516, and in a patent issued to DuPont, U.S. Pat. No. 4,634,657. U.S. Pat. No. 4,495,020 describes the combination of hexaarylbiimidazoles, leucodyes and certain photoacid generators to give coatings with enhanced electrical conductivity. Most recently, in U.S. Pat. No. 5,407,783, it was disclosed that the effectiveness of UV-induced color formation of thermally stable systems could be enhanced by the addition of certain dibromo derivatives.

Systems have been described which generate an inhibitor to color-formation by exposure to light (U.S. Pat. No. 3,390,996), heat (U.S. Pat. No. 3,390,995) or light and heat (U.S. Pat. No. 3,383,212, and U.S. Pat. No. 4,332,884). In other cases, color formation was prevented by restricting the mobility of color formation, either by use of a thermoplastic binder, which required heating of the composition before, during or subsequent to UV exposure to allow color to form (U.S. Pat. No. 3,615,567). A system also described stabilization of background after color-formation as a result of a subsequent polymerization step, effected by light or heat (U.S. Pat. No. 3,615,454) which locked the color-forming components in place.

The use of photoactive halogen compounds in combination with photosensitive biimidazoles and leucodyes in systems containing microcapsules has been described. Other modifications in which encapsulation is employed to control background and/or image stability have been reported. Thus a number of patents (U.S. Pat. Nos. 4,929,530, 4,962,009 and 4,981,769) describe systems in which color-formation is effective inside capsules and heat is employed to rupture these in order to make contact between the components of color formation with chemical fixing agents so as to stabilize the imaged areas. Here the capsules are involved in separating the imaging and fixing components and to provide a relatively stable system. All these systems require some modicum of image stabilization to prevent significant color buildup in the unimaged areas, and "add-on" of images to previously exposed image areas is difficult. No systems have been disclosed which do not undergo significant changes when viewed in ambient light, thus reducing the ability to form color effectively when re-exposed.

Without exception, all systems described above are focused on the use of ultraviolet or visible light to produce image patterns and do not contain any disclosure or even a hint thereof on the use of heat and/or near IR radiation to effect color formation.

Early work reported that color-formation of biimidazole/ leucodye systems could be achieved with other forms of radiant energy, e.g., heat or electron-beam radiation. In U.S. Pat. No. 3,585,038, it is disclosed that, only at elevated temperatures, could color-formation be achieved with HABIs and triarylmethane leuco dye salts. German Patent 2 224 725, issued to Wagner Pelikan, describes compositions of unspecified HABIs and relatively easily oxidizable leuco crystal violet, which can form colored image(s) under the influence of imagewise heating. No provision for room light stabilization of either system was reported. Most significantly, there is no disclosure or even a hint thereto in either of these two patent references of significantly improved thermally imaging compositions comprising at least one acid-generating compound in addition to a HABI compound(s) and a leuco dye(s).

Thus, in sharp contrast to photoimageable compositions imageable with ultraviolet or visible radiation, effective near infrared sensitive imageable compositions are not known to the art. A need to develop efficient compositions has been stimulated by the requirement of products which have improved sensitivity to near-IR emitting lasers.

SUMMARY OF THE INVENTION

In one embodiment, the invention is a thermally imageable composition, comprising:

(a) at least one near IR-absorbing dye having the structure selected from the group consisting of:

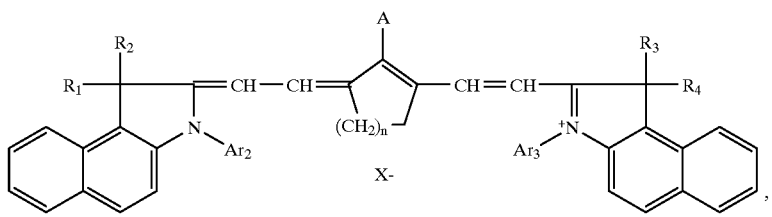

-continued

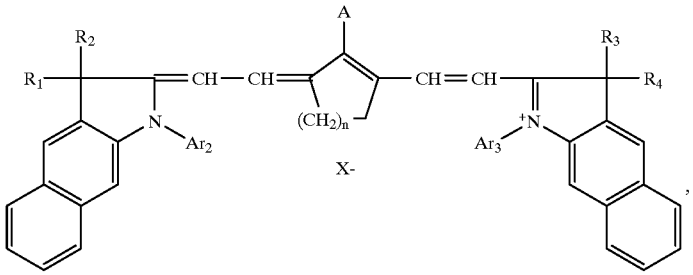

and

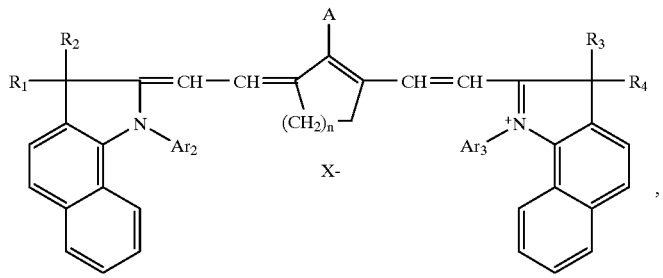

(b) at least one HABI compound;
(c) at least one leuco dye;
(d) at least one acid-generating compound; and
(e) a polymeric binder;
wherein
$R_1$–$R_4$ are independently substituted or unsubstituted $C_1$–$C_6$ alkyl;
A is substituted or unsubstituted phenyl, naphthyl, $C_1$–$C_6$ alkyl, or $C_7$–$C_{10}$ aralkyl;
$Ar_2$ and $Ar_3$ are independently substituted or unsubstituted phenyl or naphthyl;
X is a monovalent anion; and n is 1 or 2; and
wherein imaging of the composition is by thermal means involving exposing with near-IR radiation with the proviso that the composition is not imaged by UV means.

In the near IR-absorbing dye structures given above that are substituted, the substitution of alkyl, aryl, or aralkyl groups independently can be with substitutents that include, but are not limited to, hydroxy, alkoxy, chloro, bromo, cyano, and amino.

In another embodiment, the invention is a thermal process for preparing an image on a substrate comprising, in order:

(i) applying an imageable composition on the substrate, wherein the imageable composition comprises:
(a) at least one near IR-absorbing dye having the structure selected from the group consisting of:

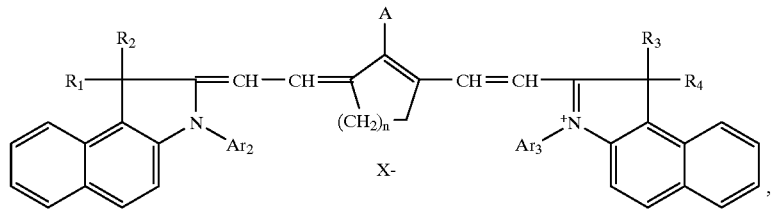

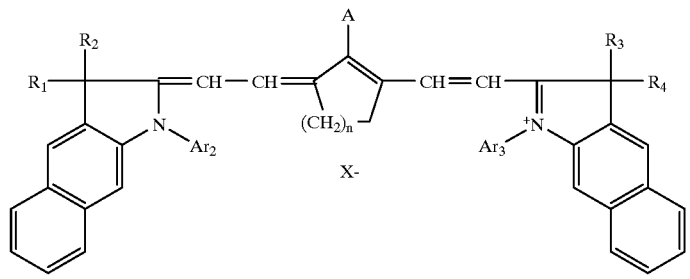

and

-continued

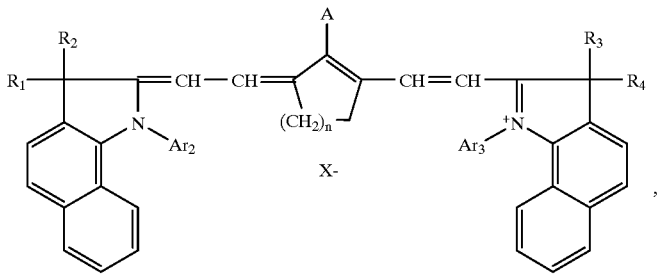

(b) at least one HABI compound;
(c) at least one leuco dye;
(d) at least one acid-generating compound; and
(e) a polymeric binder;

(ii) drying the coated imageable composition to form an imageable layer on the substrate; and (iii) imagewise exposing the layer with near-IR radiation to form imaged and non-imaged areas and to thereby form an image on the substrate, wherein $R_1$–$R_4$ are independently substituted or unsubstituted $C_1$–$C_6$ alkyl;

A is substituted or unsubstituted phenyl, naphthyl, $C_1$–$C_6$ alkyl, or $C_7$–$C_{10}$ aralkyl;

$Ar_2$ and $Ar_3$ are independently substituted or unsubstituted phenyl or naphthyl;

X is a monovalent anion; and n is 1 or 2; and wherein the imagewise exposing of the imageable layer is effected entirely by thermal means involving exposing with near-IR radiation with the proviso that the imagewise exposing of the imageable layer is not imaged by UV means.

In the near IR-absorbing dye structures given above that are substituted, the substitution of alkyl, aryl, or aralkyl groups independently can be with substitutents that include, but are not limited to, hydroxy, alkoxy, chloro, bromo, cyano, and amino.

DETAILED DESCRIPTION OF THE INVENTION

The thermally imageable compositions of this invention comprise (a) at least one near IR-absorbing dye having the structure given supra; (b) at least one HABI compound; (c) at least one leuco dye; (d) at least one acid-generating compound; and (e) a polymeric binder. Each of these components are discussed in greater detail below.

A near infrared imageable composition as defined herein is a composition in which the imaging is completely effected by thermal means obtained from near infrared radiation. In this invention, which involves compositions containing at least one near IR-absorbing dye, the thermal means to effect imaging of the composition is via exposing (of the composition) with near-IR radiation. Near IR radiation is absorbed by the near IR-absorbing dye(s) in the compositions of this invention and the dye(s) subsequently produce heat (thermal energy) to effect color formation and which affords imaging of the composition. No other type of radiation, such as ultraviolet (UV) is required or utilized in the compositions, elements, and processes of this invention, and provisions are made to exclude UV means for imaging in this invention.

The near infrared imageable compositions of this invention are sensitive to heat produced upon exposure to near infrared radiation in that colored images are formed upon imagewise exposure of a given composition with sufficient near infrared radiation, which in turn imagewise induces heating of the compositions above a certain minimum temperature required to activate color formation process(es). In sharp contrast, prior art compositions, such as those disclosed in Caruso, U.S. Pat. No. 5,407,783, differ fundamentally from the present compositions, since the former compositions are designed to be thermally stable, and the colored images are generated in an exposure step to ultraviolet radiation (UV means).

The compositions and elements of this invention can be effectively used to permit formation of add-on images. Add-on images are defined to be those images which are either created or intensified in optical density when a second or later exposure to near infrared radiation is made at a time subsequent to the first exposure which generated the initial image. In some areas of the graphic arts, it is desirable to form images, inspect these, and add further images subsequently.

Where images are developed by overall heating or stabilized by photodeactivation, formation of add-on images in acceptable density is not possible. In the compositions/elements of this invention, the images can be viewed and added to thermally.

Near IR-Absorbing Dye(s)

In this invention which involves exposure to near-IR radiation to effect imaging, at least one near IR-absorbing dye, having the structure within the scope of the invention, is present in the compositions to absorb near IR radiation, which is subsequently converted to heat (thermal energy). The heat produced in this manner is predominantly or exclusively responsible for initiation of the color forming reaction(s) that occur in forming the image. While not being bound by any theories, the following is believed to be operating in forming color images in this invention. It is believed that the heat produced subsequent to absorption of near IR radiation by a given imageable composition of this invention results in the thermal cleavage of the hexaarylbiimidazole compound(s) and the generation of triarylimidazolyl (lophyl) radicals and/or activation of the acid-generating compound to produce acid. The imidazolyl radicals in synergistic combination with the products of the thermal decomposition of the acid-generating compound in turn initiate the color-forming reaction(s) involving oxidation of a leuco dye to its corresponding colored (dye) form. Additionally the increase in temperature affords both decreased local viscosity within the coating resulting in enhanced diffusion of the active species and increased rates of reaction of these species.

Surprisingly, in this invention, selected near IR-absorbing dyes have been found to give significantly improved performance in monochrome proofing compositions relative to several comparative (prior art) near IR-absorbing dyes with respect to the former (i.e., the inventive near IR-absorbing dyes) 1) exhibiting higher rates for color formation when imaging of the compositions is by thermal means involving exposing with near-IR radiation, which means that the inventive compositions have higher thermal imaging speeds (as discussed further below); 2) affording target optical densities for the colored images that are formed at lower exposure levels; 3) affording lower background optical density levels (BKGD levels); 4) being more compatible with certain stabilizers and other desirable components of the inventive compositions; 5) provide higher visual contrast; 6) afford more pleasing visual background; 7) permits effective use of a wide range of different HABIs which yield target optical densities at acceptable fluence levels; and 8) permits effective use of a wide range of leuco dyes which yield target optical densities at acceptable fluence levels.

Under item number 1 above, the fact that the inventive compositions, containing one or more selected near IR-absorbing dyes afford higher rates for color formation when imaging is done with thermal means involving exposing with near-IR radiation, means that these compositions have higher thermal imaging speeds. When color formation occurs faster, the minimum amount of optical density needed for a given image specification will be achieved sooner with shorter exposure time and/or with use of a lower level of laser fluence (e.g., perhaps sufficient optical density will be formed with a laser fluence level of 350 mJ/cm$^2$ or lower instead of 450 mJ/cm$^2$ that might be necessary or desirable with less efficient prior art near IR-absorbing dyes).

In making these comparisons (as are given in the examples in detail), the inventive near IR-absorbing dyes were compared on a comparable basis to several leading prior art near IR dyes, including SQS and DF-1 (defined below).

The inventive compositions of this invention contain at least one near IR-absorbing dye selected from the group consisting of:

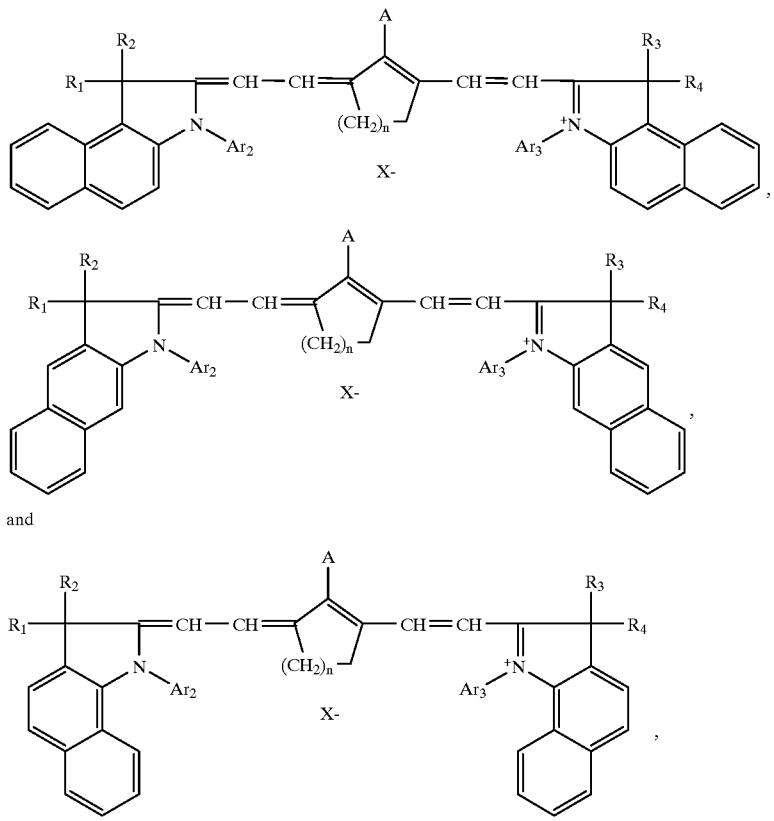

wherein
$R_1$–$R_4$ are independently substituted or unsubstituted $C_1$–$C_6$ alkyl;
A is substituted or unsubstituted phenyl, naphthyl, $C_1$–$C_6$ alkyl, or $C_7$–$C_{10}$ aralkyl;
$Ar_2$ and $Ar_3$ are independently substituted or unsubstituted phenyl or naphthyl;
X is a monovalent anion; and n is 1 or 2; and
wherein imaging of the composition is by thermal means involving exposing with near-IR radiation with the proviso that the composition is not imaged by UV means.

In the near IR-absorbing dye structures given above that are substituted, the substitution of alkyl, aryl, or aralkyl groups independently can be with substitutents that include, but are not limited to, hydroxy, alkoxy, chloro, bromo, cyano, and amino.

In this invention, suitable near IR-absorbing dyes include, but are not limited to, JC-1, JC-2, JC-3, JC-4, JC-5, and JC-6. The near IR-absorbing dyes of this invention are benz[e, f, or g]indolium-type dyes, which respectively have the structures listed in the order one, two, and three in the Markush group of structures given above.

The benz[e]indolium-type dyes are preferred as a general class. Specific preferred dyes are JC-1 and JC-2.

The most preferred near IR-absorbing dye for use in the compositions of this invention is JC-1.

With respect to the choice of near IR-absorbing dye in a given composition of this invention, the following factors are significant:

The amount of thermal energy generated is dependent on the efficiency of conversion of the near IR radiation to heat, which varies from one near IR dye to another near IR dye and which depends upon structural considerations.

The efficiency of the near IR dye is related to the overlap of the emission of the near IR source and the absorption characteristics of the dye.

HABI Compound(s)

A HABI thermal oxidation system employing near infrared radiation includes at least one HABI compound which directly furnishes free-radicals when activated with near infrared radiation. In the imaging systems of this invention, the formation of free-radicals is necessary to result in formation of an image, such as, for example, by leuco dye oxidation to form color. In the compositions, elements, and processes of this invention which all involve exposure to near-IR radiation, the radiation employed for imaging is limited to near-IR means and with the proviso that imaging is not effected using UV means.

Initiators for photochemical transformations, including hexaarylbiimidazole-type initiators, are discussed in: "Photopolymers: Radiation Curable Imaging Systems" by B. M. Monroe in Radiation Curing: Science and Technology, S. P. Pappas, Ed., Plenum, New York, 1992, pp. 399–440, and by K. K. Dietliker, in Chemistry and Technology of UV and EB Formulation for Coatings, Inks, and Paints, "Free-Radical Polymerization", P. K. T. Oldring, Ed, SITA Technology Ltd, London, Vol. 3, 1991, pp 60–525.

Certain substituted 2,4,5,2',4',5'-hexaarylbiimidazole dimers (HABIs) useful in this invention are disclosed in: Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. The HABIs disclosed in these and related patents are 2-substituted (e.g., o-Cl or o-EtO substituted) hexaphenylbiimidazoles in which the other positions on the phenyl radicals are unsubstituted or substituted with chloro, methyl or methoxy, such as:

CDM-HABI—2,2'-bis(2-chlorophenyl)-4,4',5,5'-tetrakis(3-methoxyphenyl)-1,1'-bi-1H-imidazole [29777-36-4] *=2-(o-chlorophenyl)-4,5-bis(m-methoxyphenyl) imidazole dimer

*The numbers in brackets are CAS Registration Numbers unless noted otherwise.

o-Cl-HABI—2,2'-bis(2-chlorophenyl)-4,4',5,5'-tetraphenyl-1,1'-bi-1H-imidazole [1707-68-2]

o-EtO-HABI—2,2'-bis(2-ethoxyphenyl)-4,4',5,5'-tetraphenyl-1,1'-bi-1H-imidazole [1842-62-2]

TCDM-HABI—"trichlorodimethoxy-hexaarylbiimidazole"=2,2',5-tris(2-chlorophenyl)-4-(3,4-dimethoxyphenyl)-4,5-diphenylbiimidazole (and isomers);

TCTM-HABI—2,2',4,4'-tetra(2-chlorophenyl)-5,5'-bis(3,4-dimethoxyphenyl)-1,1'-bi-1H-imidazole [77388-36-4]

Other HABIs having naphthyl substitution, such as those listed below, are useful in this invention.

N-HABI—2,2'-di(1-naphthalenyl)-4,4',5,5'-tetraphenyl-1,1'-bi-1H-imidazole [1741-29-3]

MCN-HABI—2,2'-bis(1-naphthalenyl)-4,4'-bis(2-chlorophenyl-5,5'-bis(3-methoxyphenyl)-1,1'-Bi-H-imidazole MN-HABI—2,2'-bis(2-naphthalenyl)-4,4',5,5'-tetrakis(3-methoxyphenyl)-1,1'-bi-H-imidazole HABIs having naphthenyl substitution (i.e., N-HABI) for use in photopolymerizable compositions and with photopolymerization initiated by ultraviolet (UV) means are disclosed in Wada et al., U.S. Pat. No. 4,410,621 and in Japanese Patent Publications JP 59 72,438, JP 60 95,430, JP 60 191,238, JP 60 98,433, and JP Patent Publ. No. 37377/70 (as cited on line 47, col. 1 of U.S. Pat. No. 4,410,621).

Suitable HABI compounds for this invention include, but are not limited to, all those listed in this specification.

Preferred HABI compounds (HABIs) for this invention include, but are not limited to, N-HABI, MN-HABI, MCN-HABI, and o-EtO-HABI.

The most preferred HABI compound for this invention is N-HABI.

The specific triphenylimidazolyl dimer(s) (HABI(s), HABI compounds) in this invention are present in 0.1 to 30 percent by weight of solids in the photoimaging compositions; preferably they are present in 5 to 25 percent by weight of solids; and most preferably they are present in 15 to 25 percent by weight of solids.

Leuco Dye

The leuco form of the dye which comprises one component of the thermal imaging composition of the present invention is the reduced form of the dye having one or two hydrogen atoms, the removal of which together with an additional electron in certain cases produces the dye. Such leuco dyes have been described, for example, in U.S. Pat. No. 3,445,234, column 2, line 49 to column 8, line 55. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) antinodiphenylmethanes
(i) leuco indamines
(j) aminohydrocinnamic acids (cyanoethanes, leuco methines)
(k) hydrazines
(l) leuco indigoid dyes
(m) amino-2,3-dihydroanthraquinones
(n) tetrahalo-p,p'-biphenols
(l) 2(p-hydroxyphenyl)-4,5-diphenylimidazoles
(p) phenethylanilines Of these leuco forms, (a) through (i) form the dye by losing one hydrogen atom, while the leuco forms (j) through (p) lose two hydrogen atoms to produce the parent dye. Aminotriarylmethanes are preferred. A general preferred aminotriarylmethane class is that wherein at least two of the aryl groups are phenyl groups having (a) an $R_1R_2N$-substituent in the position para to the bond to the methane carbon atom wherein $R_1$ and $R_2$ are each groups selected from hydrogen, C1 to C10 alkyl, 2-hydroxyethyl, 2-cyano-ethyl, or benzyl and, optionally, (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from
  (a) Phenyl which can be substituted with lower alkyl, lower alkoxy, chloro, diphenylamino, cyano, nitro, hydroxy, fluoro or bromo;
  (b) Naphthyl which can be substituted with amino, di-lower alkylamino, alkylamino;
  (c) Pyridyl which can be substituted with alkyl;
  (d) Quinolyl;
  (e) Indolinylidene which can be substituted with alkyl.
Preferably, $R_1$ and $R_2$ are hydrogen or alkyl of 1–4 carbon atoms. Leuco dye is present in 0.1 to 5.0 percent by weight of solids in the imaging composition.

Preferred leuco dyes in this invention include, but are not limited to, aminotriarylmethanes, aminoxanthenes, and leuco indigoid dyes.

Aminotriarylmethanes are preferred leuco dyes in this invention. Within this category (a)—aminotriarylmethanes—of leuco dyes, suitable aminotriarylmethane leuco dyes for this invention include, but are not limited to, LCV, D-LCV, LECV, D-LECV, LPCV, LBCV, LV-1, LV-2, LV-3, D-LV-1, D-LV-2, LB-8, aminotriarylmethane leuco dyes having different alkyl substituents bonded to the amino moieties wherein each alkyl group is independently selected from $C_1$–$C_4$ alkyl, and aminotriarylmethane leuco dyes comprising any of the preceding named structures that are further substituted with one or more alkyl groups on the aryl rings wherein the latter alkyl groups are independenly selected from $C_1$–$C_3$ alkyl. Preferred aminotriarylmethane leuco dyes according to this invention are D-LECV, LV-1, LV-2, D-LV-1, and D-LV-2. The most preferred aminotriarylmethane leuco dyes in this invention are LV-1 and LV-2.

LY-1 is a member of category (l) of leuco dyes as listed supra and is a more preferred leuco dye. LM-5 is a member of category (b) of leuco dyes as listed supra and is also a more preferred leuco dye.

The leuco dye(s) can be present in the compositions in any amount from 0.1 to about 25 weight percent. In most cases, it will normally be present in an amount from about 0.5 to about 18 weight percent.

Acid-Generating Compound

Various types of acid-generating compounds can be employed in the compositions of this invention individually and in combination with each other. The acid-generating compounds are those that react under thermolytic conditions, including direct heating and exposure to near-IR radiation, to afford explicit acid or to generate radicals which form acids. Acid-generating compounds that are effective in this invention include many halogenated compounds, particularly brominated compounds.

Halogenated compounds which are suitable as acid-generating compounds in this invention include, but are not limited to, substituted 1,2-dihalogenated ethanes having the structure

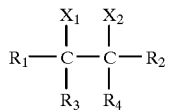

in which:
  $X_1$ and $X_2$ are independently either bromine or chlorine;
  $R_1$ is $C_6$–$C_{10}$ aryl, or aroyl, and $R_2$ is $C_6$–$C_{10}$ aryl, aroyl, acyl, or an electron withdrawing group other than halogen;

$R_3$ and $R_4$ independently are $C_6$–$C_{10}$ aryl, $C_1$–$C_{10}$ alkyl, H, or an electron withdrawing group other than halogen with the proviso that any two of $R_1$, $R_2$, $R_3$ and $R_4$ can form a $C_5$–$C_8$ membered ring structure; with the proviso that when $R_1$ or $R_3$ is $C_6$–$C_{10}$ aryl, $R_2$ and $R_4$ are not aryl.

The halogen ($X_1$ and $X_2$) is preferably bromine. The electron withdrawing groups are those known in the art and include carboxy, carboxy ester, cyano, nitro, and the like. Suitable compounds include those derived from the bromination of substituted stilbenes, chalcones, and styrenes.

Other halogenated compounds, with structure R—$CX_3$ where X is Br or Cl or I, and R is H, R'$SO_2$—, R"CO-where R, R', R" is alkyl or aryl are effective as acid-generating compounds. An example is tribromomethylphenyl sulfone (BMPS).

Specific halogenated compounds, which are suitable as acid-generating compounds for this invention, include, but are not limited to, the following: DBC (see Caruso, U.S. Pat. No. 5,407,783), DBTCE (see Holman, U.S. Pat. No. 4,634,657), BMPS, HBCD, and TCT.

Other acid-generating compounds suitable for this invention are iodonium, phosphonium, and sulfonium salts and related compounds (see, for example, the reference: "Cationic Polymerization—Iodonium and Sulfonium Salt Photoinitiators", J. Crivello, Adv. Polym. Science, 1984, pages 1–48). An example of a suitable iodonium salt acid-generating compound is diaryliodonium hexafluorophosphate.

Preferred acid-generating compounds include BMPS, DBTCE, DBC, and TCT. The most preferred acid-generating compound is BMPS.

Polymeric Binder

Various binders can be used in the compositions of this invention. Suitable binders include, but are not limited to, acrylic homopolymers, such as poly($C_1$–$C_4$ alkyl acrylates); acrylic copolymers, such as copolymers of ethyl acrylate with other acrylic and methacrylic comonomers; methacrylic homopolymers, such as PMMA; methacrylic copolymers, such as copolymers of methyl methacrylate with other methacrylic and acrylic comonomers; poly(vinyl butyral); cellulose esters, such as cellulose acetate butyrate; poly(alkylene oxides), such as poly(ethylene oxide); and poly(styrene) homopolymer and copolymers, such as brominated poly(styrene).

The preferred binders are poly(vinyl butyral) and brominated poly(styrene).

UV Stabilizers

UV stabilizers can be employed in the compositions of this invention to afford improved room light stability. Surprisingly, it was found that UV stabilizers can be present in these compositions and impart improved room light stability to the compositions without significantly otherwise detracting from the performance of the compositions, such as also giving significantly less color formation.

Suitable UV stabilizers for this invention include, but are not limited to, DMDHBP, THBP, THDBBP, DHMBP, DHDMDBBP, and DPCPI. Preferred UV stabilizers in this invention are THBP, THDBBP, and DHDMDBBP. Most preferred UV stabilizers in this invention are THBP and THDBBP.

Preferred compositions of this invention include at least one UV stabilizer. UV stabilizer levels can range from 0.1 to 20 weight percent. Preferred UV stabilizer levels are in the range of 1 to 15 weight percent, and most preferred UV stabilizer levels are in the range of 3 to 10 weight percent. More than one UV stabilizer can be employed. When more than one UV stabilizer is employed, the ranges given above apply to each UV stabilizer individually, with the maximum level for the total of all UV stabilizer levels being 30 weight percent.

In many preferred embodiments of this invention, the compositions contain at least one UV stabilizer, which contributes to the room light stability of the compositions of this invention. The presence of at least one inhibitor and/or at least one UV stabilizer is critical for the compositions of this invention to possess required room light stability.

Inhibitors

Suitable inhibitors can be used in thermally imageable compositions of this invention to prevent undesired, premature color formation upon storage at or near ambient conditions. Surprisingly, it has been found that inhibitors, even those in the antioxidant class, such as BHT, can be used at quite high levels (i.e., levels as high as 21 weight percent with respect to total composition) in this invention to prevent undesired, premature color formation, and yet the presence of these inhibitors does not significantly detract from the image densities that are obtained upon thermal imaging. Inhibitors that are suitable for this invention include, but are not limited to, BHT, PD, DEHA, MBDEEP, and MBDEMP, as well as other alkyl- and aryl-substituted hydroquinones, quinones, and phenols. Preferred inhibitors are BHT, PD, DEHA, MBDEEP, and MBDEMP. The most preferred inhibitors are BHT and DEHA.

Preferred compositions of this invention include at least one inhibitor. Inhibitor levels can range from 0.1 to 30 weight percent. Preferred inhibitor levels are in the range of 1 to 25 weight percent, and most preferred inhibitor levels are in the range of 6 to 25 weight percent. More than one inhibitor can be employed. When more than one inhibitor is employed, the ranges given above apply to each inhibitor individually, with the maximum level for the total of all inhibitor levels being 30 weight percent.

In preferred embodiments of this invention, the compositions contain at least one inhibitor, which is often present at quite high levels (e.g., 21 weight percent or higher) in order for the compositions to possess adequate room light stability. The presence of at least one inhibitor and/or at least one UV stabilizer is critical for the compositions of this invention to possess required room light stability. It is very surprising and unexpected that high levels of inhibitors, including antioxidants, such as BHT, can be employed in these compositions to impart room light stability without otherwise significantly detracting from the performance of the compositions. While one skilled in the art might have expected very significant decreases in optical density values upon imaging with these high levels of inhibitor(s), in actual fact, only modest decreases were found.

Optional Component(s)

Optionally, other additives can be present in the thermally imageable compositions of this invention. For example, the thermally imageable compositions can also contain inert infusible fillers such as titanium dioxide, organophilic colloidal silica, bentonite, powdered glass, micro-sized alumina and mica in minor, noninterfering amounts. Formulations containing micro-sized silicas, as, for example, the "Syloid" silica gels, sold by W. R. Grace & Co., are particularly useful for providing a "tooth" for pencil or ink receptivity and eliminating blocking tendencies.

One or more organic solvents can be employed to solubilize and/or disperse the high boiling (>100° C.) liquid or solid components in coating samples of the compositions of this invention. In preparing coating compositions, generally inert solvents are employed which are volatile at ordinary pressures. Examples include alcohols and ether alcohols such as methanol, ethanol, 1-propanol, 2-propanol, butanol, and ethylene glycol; esters such as methyl acetate and ethyl acetate; aromatics such as benzene, o-dichlorobenzene and toluene; ketones such as acetone, 2-butanone and 3-pentanone; aliphatic halocarbons such as methylene chloride, chloroform, 1,1,2-trichloroethane, 1,1,2,2-tetrachloroethane and 1,1,2-trichloroethylene; miscellaneous solvents such as dimethylsulfoxide, pyridine, tetrahydrofuran, dioxane, dicyanocyclobutane and 1-methyl-2-oxo-hexamethyleneimine; and mixtures of these solvents in various proportions as may be required to attain solutions and/or dispersions.

Useful optional antiblocking agents present to prevent the coatings from adhering to one another include

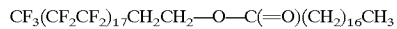

and other known agents.

There is no limitation on the amounts of optional components in this invention.

Materials of Construction

In forming a monochrome proofing product according to this invention, the thermally imageable compositions are frequently coated onto paper substrates. Both coated and uncoated papers can be employed in this invention. Other substrates can also be employed in this invention; these include, but are not limited to, polyesters, such as poly (ethylene terephthalate), and filled polyesters.

Manufacturing Process

The process of formation of an imageable dry coating is relatively simple and direct. The stable liquid imageable composition(s) of the present invention is coated onto a substrate. Various methods of coating can be employed which are well known in the art.

Substantially all solvent(s) in the liquid composition is removed which results in a dry film.

Coatings can be applied on one or both sides of preferred substrates to afford one-sided or two-sided papers or films, especially papers or filled polyester films to permit formation of two-sided exposed thermal images.

Process of Use

Thermally imageable compositions of this invention, containing near IR-absorbing dyes may be used to prepare monochrome proofing products in print-engines which depend on near IR-emitting lasers as exposure devices.

All such compositions can be applied to a substrate by coating a liquid dispersion or solution. After optional drying, if needed and selected, the coating is imagewise exposed to near IR (NIR) radiation to effect creation of an image.

Imagewise exposure to near IR radiation is made with one or more near infrared emitting lasers or other devices that generate near IR radiation. The compositions used in the process of the invention generally exhibit their maximum sensitivity in the near infrared (near IR) range, which is approximately 770–1500 nm. Therefore the radiation source should furnish an effective amount of this type of radiation.

Suitable radiation sources include diode lasers, e.g., gallium arsenide lasers emitting at 830 nm.

With laser radiation sources as are employed, the exposure times can be short, e.g., milliseconds or less, and with no upper limit.

Specifically in this embodiment, the invention is a near infrared radiation activated process for preparing an image on a substrate comprising, in order:

(i) applying an imageable composition on the substrate, wherein the imageable composition comprises:
  (a) at least one HABI compound;
  (b) at least one leuco dye;
  (c) at least one acid-generating compound;
  (d) a polymeric binder; and
  (e) at least one near IR-absorbing dye;
(ii) drying the coated imageable composition to form a imageable layer on the substrate; and
(iii) imagewise exposing the layer with near-IR radiation to form intensely colored areas and providing contrast over the non-exposed areas to thereby form an image on the substrate, wherein the imagewise exposing of the imageable layer is effected entirely by thermal means involving exposing with near-IR radiation with the proviso that the imagewise exposing of the imageable layer is not imaged by UV means.

This makes it possible to obtain quickly without additional processing, high quality, high contrast images which simulate the image quality of the electronically stored image which subsequently may be used to produce lithographic printing plates in similar print engines. Such plates generally require development prior to showing an image and in addition are more costly than proofing papers of this invention.

The exposed proofs can thus be examined by the user, to determine if plates generated from the electronically stored information will yield the desired print information and quality. They can be used in ambient light without significant deterioration.

In practice of use, it is often desirable to produce two-sided proofs. With these, subsequent to forming signatures (booklets), it is possible to approximate more closely the final printed document, when this is a multipage document. The materials of the process of this invention lend themselves to the manufacture and use of two-sided proofing products.

It is sometimes desirable to impose multiple images on a proofing product. It is feasible in analog proofing to use different intensities of irradiation to form differently intense dye images (color breaks) with different lithographic negatives (which subsequently are exposed to give plates which are used to print different colors) to denote the image that is generated with black ink, magenta ink, etc. With the proofing products of this invention, images can be formed with a lower level of irradiance (fluence level of the NIR), e.g., with half and two thirds normal fluence to show similar effects. This is an illustration of an add-on image, where the user can judge the quality of the first-formed image, prior to generating a subsequent image on the same proofing product.

An example of the special utility of the products of this invention is in their utilization where multiple images are formed. For example, one can abort the process if a previously generated image is not satisfactory. Thus if the proof of the first image is unsatisfactory, then it can be made from new input on unexposed material and subsequent images can be made after the first image is generated successfully. Thus, because the first image can be viewed in ambient light without processing, there is no time wasted in continuation the preparation of a proof when one of its components has been judged unsatisfactory.

Other illustrations of add-on images which are important can thus be given. It may be desirable, e.g., to use the same text but different illustrations on proofs, to illustrate what the ultimate print will look like. Thus a set of proofs can be made via a laser imaging unit (e.g. a CREO unit) with the same signal, and after having been viewed, these can subsequently be re-exposed via the laser imaging unit with information which will result in the imposition of pictorial information. Thus, two or more images can be imposed on the same proofing product sequentially, and because the images are instantly accessible, they can be evaluated between exposures. This is an example of imposition printing.

GLOSSARY

Leuco Dyes

| | |
|---|---|
| LCV | tris(N,N-dimethylaminophenyl)methane = 4,4',4"-methylidynetris(N,N-dimethyl)benzenamine [603-48-5]* |
| LECV | tris(N,N-diethylaminophenyl)methane = 4,4',4"-methylidynetris(N,N-diethyl)benzenamine [4865-00-3] |
| LPCV | tris(N,N-di-n-propylaminophenyl)methane = 4,4',4"-methylidynetris(N,N-di-n-propyl)benzenamine |
| LBCV | tris(N,N-di-n-butylaminophenyl)methane = 4,4',4"-methylidynetris(N,N-di-n-butyl)benzenamine |
| LV-3 | tris(4-diethylamino-2-methylphenyl)methane = 4,4',4"-methylidynetris(N,N-diethyl-3-methyl)-benzenamine [4482-70-6] |
| LV-2 | bis(4-diethylamino-2-methylphenyl)-(4-diethylaminophenyl)methane [68582-45-6] |
| LV-1 | bis(4-diethylaminophenyl)-(4-diethylamino-2-methylphenyl)methane [60813-13-0] |
| LB-8 | bis(4-diethylamino-2-methylphenyl)(3,4-dimethoxyphenyl)methane [4550-36-1] |
| D-LCV | deutero-tris(N,N-dimethylaminophenyl)methane |
| D-LECV | deutero-tris(4-diethylaminolphenyl)methane |
| D-LV-1 | deutero-bis(4-diethylaminophenyl)-(4-diethylamino-2-methylphenyl)methane |
| D-LV-2 | deutero-bis(4-diethylamino-2-methylphenyl)(4-diethylaminophenyl)methane |
| LY-1 | trans-3-hydroxy-2-(p-diethylaminobenzyl)indanone |
| LM-5 | benzo[a]-6-N,N-diethylamino-9-(2-methoxycarbonyl)-phenylxanthene, Hodogaya Chemical Co., Ltd., Japan. |

Biimidazoles (HABIs)

| | |
|---|---|
| o-Cl-HABI - | 2,2'-bis(2-chlorophenyl)-4,4',5,5'-tetraphenyl-1,1'-bi-1H-imidazole [1707-68-2] |
| o-EtO-HABI - | 2,2'-bis(2-ethoxyphenyl)-4,4',5,5'-tetraphenyl-1,1'-bi-1H-imidazole [1842-62-2] |
| TCTM-HABI - | 2,2'4,4'-tetra(2-chlorophenyl)-5,5'-bis(3,4-dimethoxyphenyl)-1,1'-bi-1H-imidazole [77388-36-4] |
| CDM-HABI - | 2,2'-bis(2-chlorophenyl)-4,4',5,5'-tetrakis(3-methoxyphenyl)1,1'-bi-1H-imidazole [29777-36-4] |
| N-HABI - | 2,2'-di(1-naphthalenyl)-4,4',5,5'-tetraphenyl-1,1'-bi-1H-imidazole [1741-29-3] |
| MN-HABI - | 2,2'-bis(2-naphthalenyl)-4,4',5,5'-tetrakis(3-methoxyphenyl)-1,1'-bi-1H-midazole |
| MCN-HABI - | 2,2'-bis(2-naphthalenyl)-4,4'-bis(2-chlorophenyl)-5,5'-bis(3,4-dimethoxy-phenyl)-1,1'-bi-1H-imidazole |

Acid-Generating Compounds

| | |
|---|---|
| BMPS | phenyl tribromomethyl sulfone [17025-47-7] |
| DBTCE | 1,2-dibromotetrachloroethane [630-25-1] |
| DBC | dibromochalcone (dibromo-benzylidene acetophenone) [611-91-6] |
| HBCD | 1,2,5,6,9,10-hexabromocyclododecane [3194-55-6] |
| CA | tetrachloro-p-benzoquinone (chloranil) [118-75-2] |
| TCT | tristrichloromethyltriazine [6542-67-2] |

-continued

GLOSSARY

DAHP  diaryliodonium hexafluorophosphate
Inhibitors

| | |
|---|---|
| BHT | 2,6-di-t-butyl-4-methylphenol [128-37-0] |
| PD | 1-phenyl-3-pyrazolidinone(phenidone) [92-43-3] |
| DEHA | diethylhydroxyamine [3710-84-7] |
| MBDEEP | 2,2'-methylenebis[6-(1,1-dimethylethyl)-4-ethylphenol |
| MBDEMP | 2,2'-methylenebis[6-(1,1-dimethylethyl)-4-methylphenol |

UV Stabilizers(Absorbing significantly at wavelengths > 380 nm)

| | |
|---|---|
| DMDHBP | 4,4'-dimethoxy-2,2'-dihydroxybenzophenone [131-51-4] |
| THBP | 2,2',4,4'-tetrahydroxybenzophenone [131-51-5] |
| THDBBP | 2,2',4,4'-tetrahydroxy-5,5'-di-t-butylbenzophenone [95283-23-1] |
| DHMBP | 2,2'-dihydroxy-4-methoxybenzophenone [131-51-3] |
| DHDMDBBP | 2,2'-dihydroxy-4,4'-dimethoxy-5,5'-di-t-butylbenzophenone |
| DPCPI | 4,5-diphenyl-2(o-chlorophenyl)imidazole [1707-67-1] |

Near IR-Absorbing Dyes

Inventive Dyes

| | |
|---|---|
| JC-1 | 2-[2[3-[[1,1-dimethyl-1,3-dihydro-3-phenyl-2H-benz[e]indol-2-ylidene]ethylidene]-2-phenyl-1-cyclohexen-1-yl]ethenyl]-1,1-dimethyl-3-phenyl-1H-benz[e]indolium p-toluenesulfonate Source: H. W. Sands Corp., Jupiter, FL |
| JC-2 | 2-[2[3-[[1,1-dimethyl-1,3-dihydro-3-phenyl-2H-benz[e]indol-2-ylidene]ethylidene]-2-phenyl-1-cyclopenten-1-yl]ethenyl]-1,1-dimethyl-3-phenyl-1H-benz[e]indolium p-toluenesulfonate |
| JC-3 | 2-[2[3-[[1,1-dimethyl-1,3-dihydro-3-phenyl-2H-benz[f]indol-2-ylidene]ethylidene]-2-phenyl-1-cyclohexen-1-yl]ethenyl]-1,1-dimethyl-3-phenyl-1H-benz[f]indolium p-toluenesulfonate |
| JC-4 | 2-[2[3-[[1,1-dimethyl-1,3-dihydro-3-phenyl-2H-benz[f]indol-2-ylidene]ethylidene]-2-phenyl-1-cyclopenten-1-yl]ethenyl]-1,1-dimethyl-3-phenyl-1H-benz[f]indolium p-toluenesulfonate |
| JC-5 | 2-[2[3-[[1,1-dimethyl-1,3-dihydro-3-phenyl-2H-benz[g]indol-2-ylidene]ethylidene]-2-phenyl-1-cyclohexen-1-yl]ethenyl]-1,1-dimethyl-3-phenyl-1H-benz[g]indolium p-toluenesulfonate |
| JC-6 | 2-[2[3-[[1,1-dimethyl-1,3-dihydro-3-phenyl-2H-benz[g]indol-2-ylidene]ethylidene]-2-phenyl-1-cyclopenten-1-yl]ethenyl]-1,1-dimethyl-3-phenyl-1H-benz[g]indolium p-toluenesulfonate |

Comparative Dyes

| | |
|---|---|
| DF-1 | 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-3H-indolium trifluoromethanesulfonate (see U. S. Pat. No. 4,882,265) [128433-68-1] |
| SQS | 4[[3-[[2,6-bis(1,10-dimethylethyl)-4H-thiopyran-4-ylidene]-methyl]-2-methyl-2-hydroxy-4-oxo-2-cyclobuten-1-ylidene]-methyl-2,6-bis(1,1-dimethylethyl)thiopyrilium hydroxide, inner salt, Pisgah Labs, Pisgah Forest, North Carolina [88878-49-3] |

Polymeric Binders

| | |
|---|---|
| PVB | Poly(vinyl butyral) |
| Butacite ® Flake | PVB from the DuPont Company, Wilmington, DE |
| Butvar ® 90 | PVB from Monsanto, St. Louis, MO |
| PDBS-80 | Brominated poly(styrene), Great Lakes Chemical, West Lafayette, Indiana |

*The number enclosed in brackets for a given compound in the glossary is the CAS Registration Number for the given compound.

EXAMPLES

These non-limiting examples demonstrate the processes, compositions, and elements claimed and described herein. All temperatures throughout the specification are in °C. (degrees Centigrade) and all percentages are weight percentages unless indicated otherwise. All HABI's and leuco dyes (except as noted above) are from Hampford Research, Stratford, Conn. Except as noted above, all other materials are from Aldrich Chemical, Milwaukee, Wis. Weights are in milligrams, unless otherwise indicated.

Exposure of materials sensitized for approximately 830 nm was effected using a CREO exposure engine (Creo Products Inc., Vancouver, British Columbia, Canada). The system used contains a rotating external drum 30 inches long and 12 inches in diameter. Samples were mounted on the rotating external drum. This CREO exposure engine contains a laser head outputting 32 individually modulated beams of approximately 70 milliwatts (mW) each, which were individually focused to approximately 7 micron spots on the sample. The rotating drum was 1 meter in circumference. The rotating drum can be spun at speeds ranging from 30 to 450 RPM to produce surface speeds on the drum ranging from 0.5 to 7.5 meters/second. Samples were held in place with adhesive tape and vacuum assist. The laser head, patented under U.S. Pat. No. 4,743,091, consisted of thirty-two approximately 830 nm, laser diodes, each with approximately 90 milliwatts of single-mode output. The laser diodes were arranged in a two dimensional 6×6 pattern of rows and columns, with columns 1 through 5 populated with 6 lasers and column 6 populated by 2 lasers. Output of each laser was passed through a collimation lens which was adjusted to focus each laser output on a plane 252 mm from the collimation lens. A two element zoom lens was used to image the 6×6 array onto the sample surface and was adjusted to determine a given spot pitch. Each individually modulated laser was focused to a 7 micron FWHM (full width at half maximum) spot. Total power on a given sample was approximately 2240 milliwatts.

Example 1

This example demonstrates the superior imaging speed, background optical density and visual appearance of films containing near IR-absorbing dye JC-1 in comparison to a leading prior art near IR-absorbing dye DF-1. Solutions S-1 to S-3 (Table 1) were coated with a #30 wire wound rod onto Reflections paper (Consolidated Paper Co. Inc., 231 First Avenue N., Wisconsin Rapids, Wis. 54495-0850) and air dried to afford respectively corresponding coated samples C-1 to C-3.

TABLE 1

| | S-1 Wt. (mg) | S-2 Wt. (mg) | S-3 Wt. (mg) |
|---|---|---|---|
| Methyl ethyl ketone | 3100.0 | 3100.0 | 3100.0 |
| Isopropyl alchohol | 3100.0 | 3100.0 | 3100.0 |
| Toluene | 3100.0 | 3100.0 | 3100.0 |
| Butacite ® Flake | 312.2 | 312.2 | 303.1 |
| N-HABI | 159.6 | 159.6 | 159.6 |
| D-LECV | 111.3 | 111.3 | 111.3 |
| BMPS | 34.3 | 34.3 | 34.3 |
| DF-1 | 7.0 | — | — |
| JC-1 | — | 7.0 | 16.1 |
| DEHA | 34.3 | 34.3 | 34.3 |
| BHT | 41.3 | 41.3 | 41.3 |

The C-1 to C-3 samples were exposed in the CREO unit to give the results presented in Table 2.

TABLE 2

| | C-1 | C-2 | C-3 |
|---|---|---|---|
| Background | 0.07 | 0.04 | 0.06 |
| Image density @ 350 mJ/cm$^2$ exposure | 0.54 | 0.78 | 1.00 |
| Relative image contrast @ 350 mJ/cm$^2$ | 1.0 | 1.6 | 2.0 |
| Image density @ 450 mJ/cm$^2$ exposure | 0.88 | 1.16 | 1.17 |
| Relative image contrast @ 450 mJ/cm$^2$ | 1.0 | 1.4 | 1.4 |
| Room light stability, mOD/fc/hr | 0.25 | 0.38 | 0.25 |
| Visual appearance of background | Pale green | Cream | Cream | where:

Background=optical density of the unexposed coated sample measured with a Macbeth RD918 reflectance densitometer using neutral filters.

Image density=optical density of an exposed area after exposure at the indicated fluence level (e.g. 350 or 450 mJ/cm$^2$).

Relative image contrast=ratio of image density of experimental sample compared to image density of a reference coating (in this case C-1) exposed at the same fluence level.

Room light stability=increase in optical density after exposure to room light at intensity of 40–100 foot candles for a measured time period of approximately 12 hours. The units of room light stability are reported in milli-optical density units per foot candle per hour (i.e., mOD/fc/hr). Lower values indicate higher room light stability.

The imaging results show that substitution of an equal weight percent of JC-1 for DF-1 yields monochrome proofing films with significantly lower background density, comparable room light stability and significantly higher imaging speed. Even when a 2.3-fold excess of JC-1 is used in comparison to DF-1, background density is still lower for the JC-1 film while imaging speed is nearly twice that for the DF-1 standard and room light stability remains comparable.

Example 2

This example demonstrates the superiority of imaging speed, and background optical density for monochrome proofing film compositions containing near IR-absorbing dye JC-1 (within the scope of the invention) with a series of HABI's in comparison to comparable film compositions containing a leading prior art near IR-absorbing dye DF-1 (which is outside the scope of the invention). Solutions S-4 to S-7, containing DF-1, were prepared (Table 3). A second nearly identical set of solutions (S-8 to S-11; Table 3) differing only in the substitution of equimolar quantities of JC-1 for DF-1 was also prepared.

TABLE 4

| | TCTM-HABI | N-HABI | o-EtO-HABI | o-Cl-HABI |
|---|---|---|---|---|
| Relative Background Density | 0.56 | 0.86 | 0.56 | 0.88 |
| Relative Contrast at 250 mJ/cm$^2$ Exposure | 2.2 | 2.0 | 2.2 | 2.0 |
| Relative Contrast at 350 mJ/cm$^2$ Exposure | 1.9 | 1.7 | 1.9 | 1.6 |
| Relative Contrast at 850 mJ/cm$^2$ Exposure | 1.1 | 0.9 | 1.1 | 1.1 |

The values in the tables show clearly that background optical densities are significantly lower for JC-1 based films compared to DF-1 based films, irrespective of which HABI is included. At the same time relative imaging speeds at both 250 and 350 mJ/cm$^2$ are much higher for the JC-1 based films. The effect on imaging speed is particularly notable at the highly desirable lower exposure levels as shown by inclusion of data for 850 mJ/cm$^2$ exposures where relative imaging speeds for the two dyes are comparable.

Example 3

This example demonstrates the superiority of imaging speed, and background density for films containing near IR-absorbing dye JC-I (within the scope of the invention) in comparison to two leading prior art near IR-absorbing dyes DF-1 and SQS (which are both outside the scope of the invention). Solutions S-12 to S-14 (Table 5), essentially identical except for the substitution of equimolar amounts of the three dyes, were coated with a #20 wire wound rod onto Reflections paper and air dried to afford corresponding coated samples C-12 to C-14.

TABLE 3

| Component | S-4 Wt. (mg) | S-5 Wt. (mg) | S-6 Wt. (mg) | S-7 Wt. (mg) | S-8 Wt. (mg) | S-9 Wt. (mg) | S-10 Wt. (mg) | S-11 Wt. (mg) |
|---|---|---|---|---|---|---|---|---|
| Methyl ethyl ketone (butanone-2) | 3100.0 | 3100.0 | 3100.0 | 3100.0 | 3100.0 | 3100.0 | 3100.0 | 3100.0 |
| Isopropyl alchohol | 3100.0 | 3100.0 | 3100.0 | 3100.0 | 3100.0 | 3100.0 | 3100.0 | 3100.0 |
| Toluene | 3100.0 | 3100.0 | 3100.0 | 3100.0 | 3100.0 | 3100.0 | 3100.0 | 3100.0 |
| Butvar ® B-90 | 299.6 | 299.6 | 299.6 | 299.6 | 295.5 | 295.5 | 295.5 | 295.5 |
| N-HABI | — | — | — | — | — | 161.0 | — | — |
| o-EtO-HABI | — | — | 161.0 | — | — | — | 161.0 | — |
| TCTM-HABI | 161.0 | 161.0 | — | — | 161.0 | — | — | — |
| o-Cl-HABI | — | — | — | 161.0 | — | — | — | 161.0 |
| LV-1 | 112.0 | 112.0 | 112.0 | 112.0 | 112.0 | 112.0 | 112.0 | 112.0 |
| BMPS | 35.0 | 35.0 | 35.0 | 35.0 | 35.0 | 35.0 | 35.0 | 35.0 |
| DF-1 | 8.4 | 8.4 | 8.4 | 8.4 | — | — | — | — |
| JC-1 | — | — | — | — | 12.5 | 12.5 | 12.5 | 12.5 |
| BHT | 84.0 | 84.0 | 84.0 | 84.0 | 84.0 | 84.0 | 84.0 | 84.0 |

The solutions were coated with a #30 wire wound rod onto Reflections paper and air dried to give the corresponding set of coated samples C-4 to C-11. The coated samples were exposed in the CREO unit to give the results presented in Table 4, where the terms in the table are defined below.

Relative Contrast=(OD(JC-1)–Background(JC-1))/((OD(DF-1)–Background(DF-1))

where OD(JC-1), OD(DF-1)=image densities at specified exposure level for samples containing JC-1 and DF-1, respectively.

Relative Background Density=Background(JC-1)/Background(DF-1)

TABLE 5

| Component | S-12 Wt. (mg) | S-13 Wt. (mg) | S-14 Wt. (mg) |
|---|---|---|---|
| Methyl ethyl ketone | 2983.0 | 2983.7 | 2981.0 |
| Isopropyl alchohol | 2983.0 | 2983.7 | 2981.0 |
| Toluene | 2983.0 | 2983.7 | 2981.0 |
| Butvar ® B-90 | 470.8 | 472.1 | 468.3 |
| N-HABI | 241.7 | 242.3 | 242.1 |
| LV-1 | 84.1 | 83.9 | 84.6 |
| LV-2 | 84.1 | 83.9 | 84.6 |

TABLE 5-continued

| Component | S-12 Wt. (mg) | S-13 Wt. (mg) | S-14 Wt. (mg) |
|---|---|---|---|
| BMPS | 52.6 | 52.5 | 52.9 |
| DF-1 | 12.6 | — | — |
| JC-1 | — | — | 19.0 |
| SQS | — | 9.4 | — |
| BHT | 105.1 | 104.9 | 105.7 |

The coated samples were exposed in the CREO unit to give the results presented in Table 6, where the terms in the table are defined below.

Relative Contrast=R(DF-1 or SQS)=(OD(JC-1)−Background(JC-1))/((OD(DF-1 or SQS)−Background (DF-1 or SQS))

where OD(JC-1), OD(DF-1 or SQS)=image densities at specified exposure level for samples containing JC-1 and DF-1, and SQS respectively.

Relative Background Density=Background(JC-1)/Background(DF-1 or SQS).

TABLE 6

|  | R (DF-1) | R (SQS) |
|---|---|---|
| Relative Background Density | 0.4 | 0.6 |
| Relative Contrast at 250 mJ/cm$^2$ Exposure | 2.5 | 3.5 |
| Relative Contrast at 350 mJ/cm$^2$ Exposure | 1.9 | 2.2 |
| Relative Contrast at 850 mJ/cm$^2$ Exposure | 0.9 | 1.2 |

The data show the film composition containing JC-1 has lower background optical density than those comparable film compositions for either DF-1 or SQS. Imaging speeds at the desirable low exposure levels (250, 350 mJ/cm$^2$) were found to be significantly higher for the JC-1 film composition compared to those corresponding films for either DF-1 or SQS. The speed enhancement is specific to the lower exposure levels as shown by the comparable imaging speeds at 850 mJ/cm$^2$.

Example 4

This example demonstrates the superior solution stability of compositions containing the preferred color formation inhibitor DEHA in combination with dye JC-1 in comparison to identical compositions using the previously preferred dye DF-1. Solutions S-15 and S-16 (Table 7) identical except for the substitution of equimolar amounts of the two dyes were coated with a #20 wire wound rod onto Reflections paper and air dried to afford corresponding coated samples C-15 and C-16. Following the initial coating using the freshly prepared solutions, the solutions were stored in the dark under ambient conditions for 14 hrs. Following aging, the solutions were coated with a #20 wire wound rod onto Reflections paper and air dried.

TABLE 7

| Component | S-15 Wt. (mg) | S-16 Wt. (mg) |
|---|---|---|
| Methyl ethyl ketone | 2973.0 | 2971.0 |
| Isopropyl alchohol | 2973.0 | 2971.0 |
| Toluene | 2973.0 | 2971.0 |
| Butvar ® B-90 | 469.5 | 469.2 |
| N-HABI | 241.1 | 241.0 |
| LV-1 | 83.9 | 83.8 |

TABLE 7-continued

| Component | S-15 Wt. (mg) | S-16 Wt. (mg) |
|---|---|---|
| LV-2 | 83.9 | 83.8 |
| BMPS | 52.4 | 52.4 |
| DF-1 | 13.0 | — |
| JC-1 | — | 19.4 |
| DEHA | 32.4 | 32.6 |
| BHT | 104.9 | 104.8 |

Background optical densities and visual appearance of the two sets of coated samples are presented in Table 8.

TABLE 8

|  | C-15 | C-16 |
|---|---|---|
| Background density, freshly prepared coating solution | 0.10 | 0.04 |
| Background appearance, freshly prepared coating solution | Pale Green | Cream |
| Background density, coating solution stored 14 hours | 0.37 | 0.09 |
| Background appearance, coating solution stored 14 hours | Red-Brown | Cream |

Example 5

This example demonstrates image formation with various leuco dyes in film compositions containing the near IR-absorbing dye JC-1 (which is within the scope of the invention). Solutions S-17 to S-20 (Table 9) were coated with a #30 wire wound rod onto Reflections paper and air dried at ambient temperature to afford corresponding coated film samples C-17 to C-20.

TABLE 9

| Component | S-17 Wt. (mg) | S-18 Wt. (mg) | S-19 Wt. (mg) | S-20 Wt. (mg) |
|---|---|---|---|---|
| Methyl ethyl ketone | 3102.7 | 3102.7 | 3102.7 | 3102.7 |
| Isopropyl alchohol | 3102.7 | 3102.7 | 3102.7 | 3102.7 |
| Toluene | 3102.7 | 3102.7 | 3102.7 | 3102.7 |
| Butacite ® Flake | 302.7 | 302.7 | 302.7 | 302.7 |
| N-HABI | 157.8 | 157.8 | 157.8 | 157.8 |
| D-LECV | 110.4 | — | — | — |
| LV-1 | — | — | 110.4 | — |
| LV-2 | — | 110.4 | — | — |
| LB-8 | — | — | — | 110.4 |
| BMPS | 34.6 | 34.6 | 34.6 | 34.6 |
| JC-1 | 10.4 | 10.4 | 10.4 | 10.4 |
| DEHA | 34.6 | 34.6 | 34.6 | 34.6 |
| BHT | 41.5 | 41.5 | 41.5 | 41.5 |

The coated samples (C-17 to C-20) were exposed in the CREO unit to give the results shown in Table 10.

TABLE 10

|  | C-17 | C-18 | C-19 | C-20 |
|---|---|---|---|---|
| Background Density | 0.07 | 0.05 | 0.07 | 0.05 |
| Image density @ 450 mJ/cm$^2$ exposure | 1.20 | 0.76 | 1.06 | 0.50 |
| Room light stability, mOD/fc/hr | 0.50 | 0.13 | 0.38 | <0.13 |

The results in each case for this set of samples (with each containing a different leuco dye) were that for each sample, the background (optical) density and room light stability values were desirably low and the image density values were desirably high.

As illustrated above, these compositions, containing the JC-1 dye within the scope of the invention, upon exposure to near IR at a fluence level of 450 mJ/cm$^2$, afforded desirably low background optical densities and room light stability values and desirably high optical densities. The four different compositions evaluated in this example each contained a separate leuco dye (out of four that were tested).

Example 6

This example demonstrates image formation with HABI's other than N-HABI in film compositions containing the near IR-absorbing dye JC-1. Solutions S-21 to S-23 (Table 11) were coated with a #30 wire wound rod onto Reflections paper and air dried at ambient temperature to afford corresponding coated samples C-21 to C-23.

Example 7

This example demonstrates the effective increase in room light stability of several different film compositions containing the near IR-absorbing dye JC-1 (within the scope of the invention) through the addition of UV absorber(s) and inhibitor(s). The example also demonstrates the excellent solution stability of JC-1 in the presence of the preferred color formation inhibitor DEHA. Solutions S-24 through S-28 (Table 13) were coated with a #30 wire wound rod onto Reflections paper and air dried at ambient temperature to afford corresponding coated film samples C-24 through C-28.

TABLE 13

| Component | S-24 Wt. (mg) | S-25 Wt. (mg) | S-26 Wt. (mg) | S-27 Wt. (mg) | S-28 Wt. (mg) |
| --- | --- | --- | --- | --- | --- |
| Methyl ethyl ketone | 3130.0 | 3130.0 | 3100.0 | 3100.0 | 3100.0 |
| Isopropyl alchohol | 3130.0 | 3130.0 | 3100.0 | 3100.0 | 3100.0 |
| Toluene | 3130.0 | 3130.0 | 3100.0 | 3100.0 | 3100.0 |
| Butacite ® Flake | 238.1 | 227.4 | 234.9 | 234.9 | 234.9 |
| o-OEt HABI | 162.9 | 156.8 | 161.0 | 161.0 | 161.0 |
| LV-1 | 113.5 | 109.2 | 112.0 | 112.0 | 112.0 |
| BMPS | 35.4 | 34.2 | 35.0 | 35.0 | 35.0 |
| JC-1 | 10.4 | 10.4 | 10.2 | 10.2 | 10.2 |
| THBP | — | — | — | — | 70.0 |
| THDBBP | — | — | 70.0 | — | — |
| DEHA | 7.1 | 31.2 | 35.0 | 35.0 | 35.0 |
| BHT | 42.7 | 40.9 | 42.0 | 112.0 | 42.0 |

TABLE 11

| Component | S-21 Wt. (mg) | S-22 Wt. (mg) | S-23 Wt. (mg) |
| --- | --- | --- | --- |
| Methyl ethyl ketone | 3103.7 | 3096.3 | 3103.7 |
| Isopropyl alchohol | 3103.7 | 3096.3 | 3103.7 |
| Toluene | 3103.7 | 3096.3 | 3103.7 |
| Butacite ® Flake | 299.2 | 298.6 | 299.2 |
| o-OEt HABI | 159.0 | — | — |
| o-Cl HABI | — | 182.0 | — |
| N-HABI | — | — | 159.0 |
| D-LECV | 110.2 | 110.0 | 110.2 |
| BMPS | 34.5 | 34.4 | 34.5 |
| JC-1 | 10.3 | 10.3 | 10.3 |
| DEHA | 34.5 | 34.4 | 34.5 |
| BHT | 41.3 | 41.2 | 41.3 |

The coated samples were exposed in the CREO unit to give the results presented in Table 12.

TABLE 12

|  | C-21 | C-22 | C-23 |
| --- | --- | --- | --- |
| Background Density | 0.06 | 0.06 | 0.06 |
| Image density @ 450 mJ/cm$^2$ exposure | 1.03 | 0.97 | 0.95 |
| Room light stability, mOD/fc/hr | 0.38 | 0.63 | 0.50 |

This above results illustrate that the inventive compositions containing the near IR-absorbing dye JC-1 are effective in affording desirably high image densities and desirably low background optical density and room light stability values in cases of compositions having several different HABI initiator components.

The samples were exposed in the CREO unit to give the results presented in Table 14.

TABLE 14

|  | C-24 | C-25 | C-26 | C-27 | C-28 |
| --- | --- | --- | --- | --- | --- |
| Background | 0.05 | 0.05 | 0.06 | 0.06 | 0.06 |
| Image density @ 450 mJ/cm$^2$ exposure | 0.92 | 0.86 | 0.85 | 0.85 | 0.84 |
| Room light stability, mOD/fc/hr | 0.39 | 0.29 | 0.18 | 0.20 | 0.17 |

The data show that as DEHA is increased from the low level in C-24 sample to the much higher level in C-25 sample, image density decreased by only 6.5%, while room light stability improved by 25%. Further additions of UV stabilizer (C-26 and C-28) yield nearly identical background densities and image densities with further dramatic improvements in room light stability. Similar improvements are observed for higher levels of BHT stabilizer (C-27).

Solutions for the above coatings were stored in the dark under ambient conditions for 72 hours and recoated and imaged in an identical fashion to the fresh coatings. The resulting films showed only slightly diminished properties compared to freshly coated films, as presented in Table 15.

TABLE 15

|  | C-24 | C-25 | C-26 | C-27 | C-28 |
| --- | --- | --- | --- | --- | --- |
| Background | 0.08 | 0.09 | 0.12 | 0.10 | 0.13 |
| Image density @ 450 mJ/cm$^2$ exposure | 1.07 | 0.89 | 0.87 | 0.86 | 0.81 |
| Room light stability, mOD/fc/hr | 0.44 | 0.23 | 0.10 | 0.13 | 0.23 |

Example 8

This example gives the synthesis of near IR-absorbing dye JC-2, which is 2[2[3-[[1,1-dimethyl-1,3-dihydro-3-phenyl-2H-benz[e]indol-2-ylidene]-ethylidene]-2-phenyl-1-cyclopenten-1-yl]ethenyl]-1,1-dimethyl-3-phenyl-1H-benz[e]indolium p-toluenesulfonate=1,1'-Diphenyl-3,3,3',3'-tetramethyl-4,5,4',5'-dibenzo-10,12-(dimethylene)-11-phenylindotricarbocyanine p-toluenesulfonate Following the procedure of Manabe, et. al., U.S. Pat. No. 5,055,589, N-phenyl-2-naphthylamine is condensed with 3-bromo-2-butanone in refluxing pyridine. After extraction and removal of solvent 3,3-dimethyl-2-methylene-1-phenyl-3H-benz[e]indole-1-phenyl-2-methylene-3,3-dimethyl-3H-benz[3]indole is obtained.

3,3-dimethyl-2-methylene-1-phenyl-3H-benz[e]indole-1-phenyl-2-methylene-3,3-dimethyl-3H-benz[3]indole and N-[[2-phenyl-3-[(phenylamino)methylene]-1-cyclopenten-1-yl]methylene]-benzenamine are mixed together with acetic acid, acetic anhydride and anhydrous sodium acetate. The mixture is refluxed until dye formation is complete, then cooled, and filtered. The filtrate is poured into a 15-fold excess of diethyl ether and the mixture stirred until the product is solidified.

The resulting solid dye is dissolved in the minimum amount of methanol. A ten fold excess of p-toluenesulfonic acid (measured relative to the amount of acetate present) is added. The mixture is stirred with the slow removal of solvent to yield the corresponding p-toluenesulfonate salt. Upon removal of solvent and drying in vacuo, the product is collected, reslurried in diethyl ether, filtered, and dried to yield dye JC-2.

What is claimed is:

1. A thermally imageable composition, comprising:

(a) at least one near IR absorbing dye having the structure selected from the group consisting of:

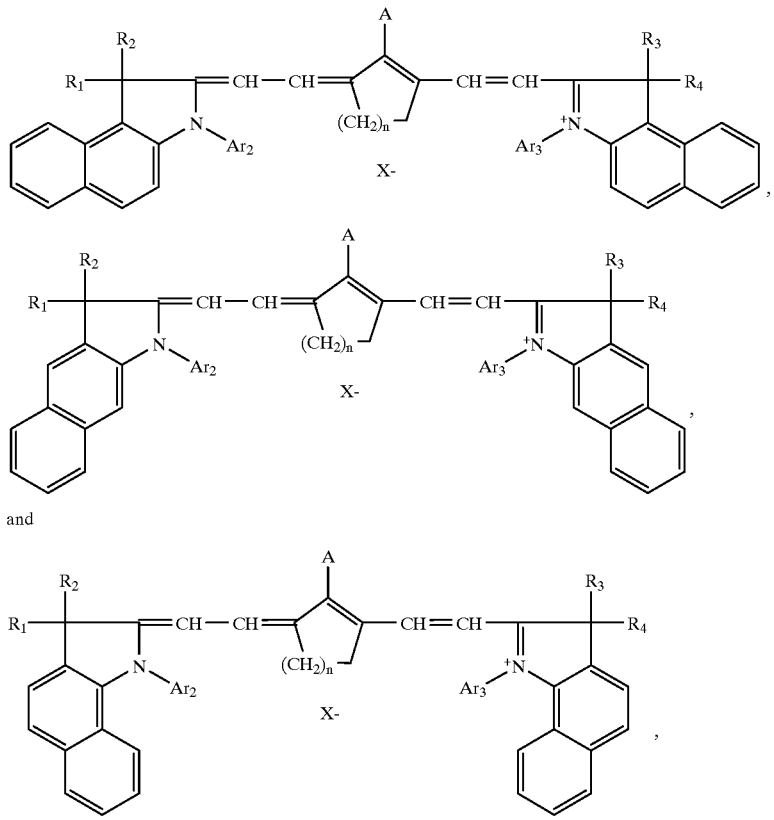

and (b) at least one HABI compound;
   (c) at least one leuco dye;
   (d) at least one acid-generating compound; and
   (e) a polymeric binder;

wherein
   $R_1$–$R_4$ are independently substituted or unsubstituted $C_1$–$C_6$ alkyl;
   A is substituted or unsubstituted phenyl, naphthyl, $C_1$–$C_6$ alkyl, or $C_7$–$C_{10}$ aralkyl;
   $Ar_2$ and $Ar_3$ are independently substituted or unsubstituted phenyl or naphthyl;
   X is a monovalent anion; and n is 1 or 2; and
   wherein imaging of the composition is by thermal means involving exposing with near-IR radiation with the proviso that the composition is not imaged by UV means.

2. The composition of claim 1 further comprising at least one inhibitor selected from the group consisting of BHT, PD, DEHA, MBDEEP, and MBDEMP.

3. The composition of claim 2 further comprising at least one UV stabilizer, which absorbs at wavelengths greater than or equal to 380 nm, and which is selected from the group consisting of polyhydroxybenzophenones, triarylimidazoles, and hydroxyphenylbenzotriazoles.

4. The composition of claim 3 wherein the at least one UV stabilizer is selected from the group consisting of DMDHBP, THBP, THDBBP, DHMBP, DHDMDBBP, and DPCPI.

5. The composition of claim 1 wherein the acid-generating compound is selected from the group consisting of DBTCE, BMPS, DBC, a sulfonium salt of the formula $R_1R_2R_3S^+X^-$, an iodonium salt of the formula $R_1R_2I^+X^-$, and a phosphonium salt of the formula $R_1R_2R_3R_4P^+X^-$, wherein $R_1-R_4$ are independently aryl or substituted aryl and X is a monovalent ion.

6. The composition of claim 1 wherein the leuco dye is selected from the group consisting of aminotriarylmethanes, aminoxanthenes, and leuco indigoid dyes.

7. The composition of claim 6 wherein the leuco dye is selected from the group consisting of LCV, LV-1, LV-2, LV-3, D-LECV, D-LCV, D-LV-1, D-LV-2, LY-1, and LM-5.

8. The composition of claim 1 wherein the HABI compound is selected from the group consisting of o-Cl-HABI, TCTM-HABI, CDM-HABI, N-HABI, MN-HABI, MCN-HABI, and RO-HABI, where R, in the RO-HABI, is a linear or branched $C_1-C_6$ alkyl.

9. The composition of claim 1 wherein the polymeric binder is selected from the group consisting of poly(vinyl butyral), cellulose esters and brominated poly(styrene).

10. The composition of claim 1 wherein the optical density obtained upon thermal imaging is at least 0.5 with use of a neutral filter when imaging is effected by near IR radiation of wavelength in the range from 770 nm to 900 nm and having a fluence level in the range from 250 mJ/cm² to 1 J/cm².

11. A thermally imageable element, comprising:
   (1) a support; and
   (2) a thermally imageable composition, comprising:
      (a) at least one near IR absorbing dye having the structure selected from the group consisting of:
      (b) at least one HABI compound;
      (c) at least one leuco dye;
      (d) at least one acid-generating compound; and
      (e) a polymeric binder;
   wherein
      $R_1-R_4$ are independently substituted or unsubstituted $C_1-C_6$ alkyl;
      A is substituted or unsubstituted phenyl, naphthyl, $C_1-C_6$ alkyl, or $C_7-C_{10}$ aralkyl;
      $Ar_2$ and $Ar_3$ are independently substituted or unsubstituted phenyl or naphthyl;
      X is a monovalent anion; and n is 1 or 2; and
   wherein imaging of the composition is by thermal means involving exposing with near-IR radiation with the proviso that the composition is not imaged by UV means.

12. The thermally imageable element of claim 11, wherein the composition further comprises at least one inhibitor selected from the group consisting of BHT, PD, DEHA, MBDEEP, and MBDEMP.

13. The thermally imageable element of claim 12, wherein the composition further comprises at least one UV stabilizer, which absorbs at wavelengths greater than or equal to 380 nm, and which is selected from the group consisting of polyhydroxybenzophenones, triarylimidazoles, and hydroxyphenylbenzotriazoles.

14. The thermally imageable element of claim 13 wherein the at least one UV stabilizer present in the composition is selected from the group consisting of DMDHBP, THBP, THDBBP, DHMBP, DHDMDBBP, and DPCPI.

15. The thermally imageable element of claim 11 wherein the acid-generating compound present in the composition is

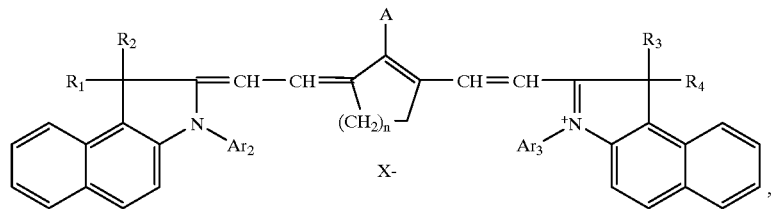

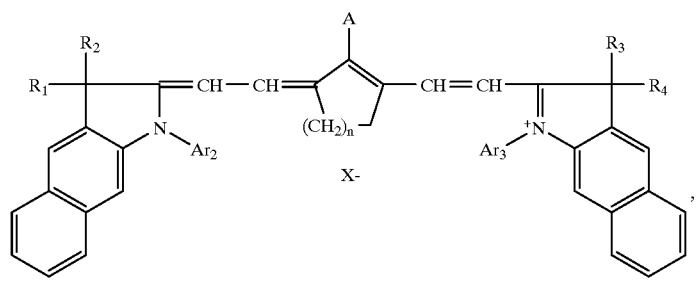

and

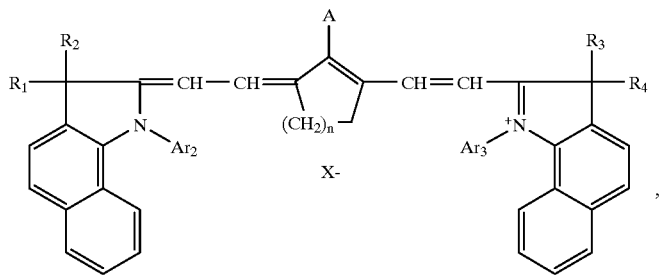

selected from the group consisting of DBTCE, BMPS, DBC, a sulfonium salt of the formula $R_1R_2R_3S^+X^-$, an iodonium salt of the formula $R_1R_2I^+X^-$, and a phosphonium salt of the formula $R_1R_2R_3R_4P^+X^-$, wherein $R_1$–$R_4$ are independently aryl or substituted aryl and X is a monovalent ion.

16. The thermally imageable element of claim 11 wherein the leuco dye of the composition is selected from the group consisting of aminotriarylmethanes, aminoxanthenes, and leuco indigoid dyes.

17. The thermally imageable element of claim 16 wherein the leuco dye is selected from the group consisting of LCV, LV-1, LV-2, LV-3, D-LECV, D-LCV, D-LV-1, D-LV-2, LY-1, and LM-5.

18. The thermally imageable element of claim 11 wherein the HABI compound present in the composition is selected from the group consisting of o-Cl-HABI, TCTM-HABI, CDM-HABI, N-HABI, MN-HABI, MCN-HABI, and RO-HABI, where R, in the RO-HABI, is a linear or branched $C_1$–$C_6$ alkyl group.

19. The thermally imageable element of claim 11 wherein the polymeric binder of the composition is selected from the group consisting of poly(vinyl butyral), cellulose esters and brominated poly(styrene).

20. The thermally imageable element of claim 11 wherein the optical density obtained upon thermal imaging is at least 0.5 with use of a neutral filter when imaging is effected by near IR radiation of wavelength in the range from 770 nm to 900 nm and having a fluence level in the range from 250 $mJ/cm^2$ to 1 $J/cm^2$.

21. A thermal process for preparing an image on a substrate comprising, in order:
    (i) applying an imageable composition on the substrate, wherein the imageable composition comprises:
        (a) at least one near IR absorbing dye having the structure selected from the group consisting of:

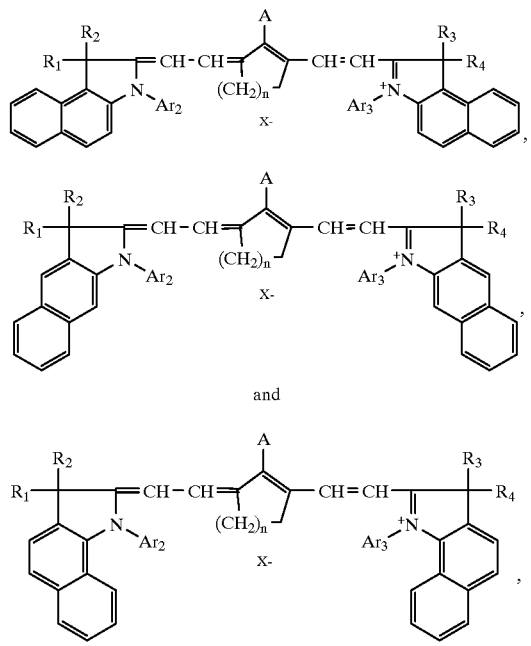

and (b) at least one HABI compound;
(c) at least one leuco dye;
(d) at least one acid-generating compound; and
(e) a polymeric binder;

(ii) drying the coated imageable composition to form an imageable layer on the substrate; and
(iii) imagewise exposing the layer with near-IR radiation to form imaged and non-imaged areas and to thereby form an image on the substrate;

wherein
$R_1$–$R_4$ are independently substituted or unsubstituted $C_1$–$C_6$ alkyl;
A is substituted or unsubstituted phenyl, naphthyl, $C_1$–$C_6$ alkyl, or $C_7$–$C_{10}$ aralkyl;
$Ar_2$ and $Ar_3$ are independently substituted or unsubstituted phenyl or naphthyl;
X is a monovalent anion; and n is 1 or 2; and
wherein the imagewise exposing of the imageable layer is effected entirely by thermal means involving exposing with near-IR radiation with the proviso that the imagewise exposing of the imageable layer is not imaged by UV means.

22. The process of claim 21, wherein the composition further comprises at least one inhibitor selected from the group consisting of BHT, PD, DEHA, MBDEEP, and MBDEMP.

23. The process of claim 22, wherein the composition further comprises at least one UV stabilizer, which absorbs at wavelengths greater than or equal to 380 nm, and which is selected from the group consisting of polyhydroxybenzophenones, triarylimidazoles, and hydroxyphenylbenzotriazoles.

24. The process of claim 23, wherein the at least one UV stabilizer of the composition is selected from the group consisting of DMDHBP, THBP, THDBBP, DHMBP, DHDMDBBP, and DPCPI.

25. The process of claim 21 wherein the acid-generating compound of the composition is selected from the group consisting of DBTCE, BMPS, DBC, a sulfonium salt of the formula $R_1R_2R_3S^+X^-$, an iodonium salt of the formula $R_1R_2I^+X^-$, and a phosphonium salt of the formula $R_1R_2R_3R_4P^+X^-$, wherein $R_1$–$R_4$ are independently aryl or substituted aryl and X is a monovalent ion.

26. The process of claim 21 wherein the leuco dye of the composition is selected from the group consisting of aminotriarylmethanes, aminoxanthenes, and leuco indigoid dyes.

27. The process of claim 26 wherein the leuco dye is selected from the group consisting of LCV, LV-1, LV-2, LV-3, D-LECV, D-LCV, D-LV-1, D-LV-2, LY-1, and LM-5.

28. The process of claim 21 wherein the HABI compound present in the composition is selected from the group consisting of o-Cl-HABI, TCTM-HABI, CDM-HABI, N-HABI, MN-HABI, MCN-HABI and RO-HABI, where R, in the RO-HABI, is a linear or branched $C_1$–$C_6$ alkyl group.

29. The process of claim 21 wherein the polymeric binder of the composition is selected from the group consisting of poly(vinyl butyral), cellulose esters and brominated poly (sytrene).

30. The process of claim 21 wherein the optical density obtained upon thermal imaging is at least 0.5 with use of a neutral filter when imaging is effected by near IR radiation of wavelength in the range of 770 nm to 900 nm and having a fluence level in the range of 250 $mJ/cm^2$ to 1 $J/cm^2$.

31. An image on a substrate made in accordance with the process of claim 21.

* * * * *